(12) United States Patent
Shin

(10) Patent No.: US 11,531,494 B2
(45) Date of Patent: Dec. 20, 2022

(54) STORAGE DEVICE AND METHOD OF OPERATING THE SAME

(71) Applicant: SK hynix Inc., Gyeonggi-do (KR)

(72) Inventor: Dong Jae Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 138 days.

(21) Appl. No.: 16/893,055

(22) Filed: Jun. 4, 2020

(65) Prior Publication Data

US 2021/0181985 A1 Jun. 17, 2021

(30) Foreign Application Priority Data

Dec. 17, 2019 (KR) .......... 10-2019-0169113

(51) Int. Cl.
*G06F 3/06* (2006.01)
*G11C 11/408* (2006.01)

(52) U.S. Cl.
CPC .......... *G06F 3/0659* (2013.01); *G06F 3/0617* (2013.01); *G06F 3/0653* (2013.01); *G06F 3/0679* (2013.01); *G11C 11/4085* (2013.01)

(58) Field of Classification Search
CPC ...... G06F 3/061; G06F 3/0617; G06F 3/0653; G06F 3/0658; G06F 3/0659; G06F 3/0673; G06F 3/0679; G06F 11/3037; G11C 7/1063; G11C 11/4085; G11C 11/5642; G11C 16/08; G11C 16/26
See application file for complete search history.

(56) References Cited

U.S. PATENT DOCUMENTS

| 10,585,615 | B1* | 3/2020 | Kadam | .................. G06F 3/0659 |
| 2008/0094927 | A1* | 4/2008 | Kim | .................. G11C 16/3427 |
| | | | | 365/204 |
| 2018/0373655 | A1* | 12/2018 | Liu | .......... G06F 13/30 |

FOREIGN PATENT DOCUMENTS

| KR | 10-0843546 | 7/2008 |
| KR | 10-2018-0115846 | 10/2018 |

* cited by examiner

*Primary Examiner* — Larry T Mackall
(74) *Attorney, Agent, or Firm* — IP & T Group LLP

(57) ABSTRACT

Provided herein may be a storage device configured to check a status of a memory device based on data read without output of a status check command, and determine a subsequent command to be generated. The storage device may include a memory device and a memory controller configured to control the memory device. The memory device may include a read data generator configured to generate new read data including both read data corresponding to a read command received from the memory controller and information indicating a status of the memory device. The memory controller may include: a status information determiner configured to determine the status of the memory device based on the new read data received from the read data generator and generate status information and a command generator configured to generate a command to be output to the memory device based on the status information.

15 Claims, 18 Drawing Sheets

STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0169113, filed on Dec. 17, 2019, which is incorporated herein by reference in its entirety.

BACKGROUND

Field of Invention

Various embodiments of the present disclosure generally relate to an electronic device, and more particularly, to a storage device and a method of operating the storage device.

Description of Related Art

Generally, a storage device stores data under control of a host device such as a computer, a smartphone, or a smartpad. A storage device may be a hard disk drive (HDD) which stores data in a magnetic disk, or a semiconductor device such as a solid state drive (SSD) or a memory card which stores data in a semiconductor memory, particularly, a nonvolatile memory.

The storage device may include a memory device in which data is stored, and a memory controller configured to store data in the memory device. A memory device may be of a volatile type or nonvolatile type. Representative examples of nonvolatile memory devices include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a method capable of determining a status of a memory device based on data read without output of a status check command.

An embodiment of the present disclosure may provide for a storage device including a memory device and a memory controller configured to control the memory device. The memory device may include a read data generator configured to generate new read data including both read data corresponding to a read command received from the memory controller and information indicating a status of the memory device. The memory controller may include: a status information determiner configured to determine the status of the memory device based on the new read data received from the read data generator and generate status information and a command generator configured to generate a command to be output to the memory device based on the status information.

An embodiment of the present disclosure may provide for a storage device including a memory device and a memory controller configured to control the memory device. The memory device comprises a read data generator configured to output, during a read operation corresponding to a read command received from the memory controller, read data corresponding to the read operation to the memory controller at a same time as word line discharge.

An embodiment of the present disclosure may provide for a method of operating a storage device, including: generating, by a memory controller of the storage device, a read command corresponding to a read request from a host, generating, by a memory device of the storage device, new read data including both data corresponding to the read command and first status information of the memory device, determining, by the memory controller, a status of the memory device based on the new read data and generating, by the memory controller, second status information and generating, by the memory controller, a command to be output to the memory device based on the second status information.

An embodiment of the present disclosure may provide for an operating method of a memory system including a memory device and a controller. The operating method of a memory system comprises providing, by the controller, a read command to the memory device, providing, by the memory device in response to the read command, read data together with status of the memory device while discharging a word line immediately after sensing the read data and providing, by the controller, a subsequent command according to the status of the memory device.

DETAILED DESCRIPTION

Specific structural and functional description provided herein is directed to embodiments of the present disclosure. However, various aspects of the invention may be configured or arranged differently than disclosed herein. Thus, the present invention is not limited by or to any of the disclosed embodiments.

Various embodiments of the present disclosure are described more fully below with reference to the accompanying drawings, so that those skilled in the art can easily carry out and practice the present invention. Throughout the specification, reference to "an embodiment," "another embodiment" or the like is not necessarily to only one embodiment, and different references to any such phrase are not necessarily to the same embodiment(s).

Figure 1:
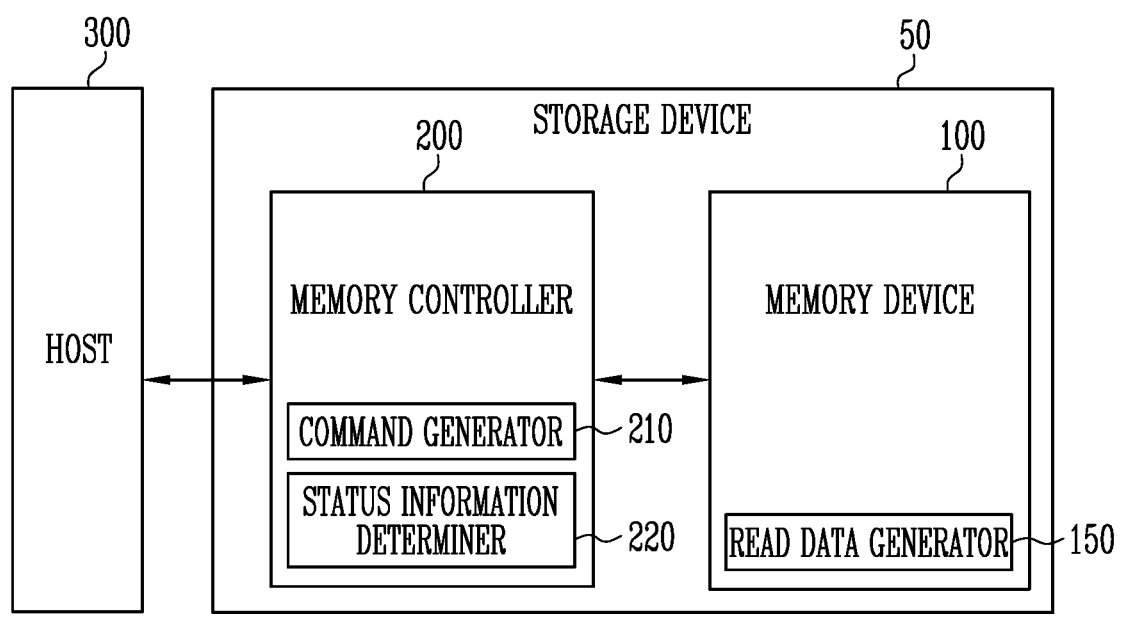
FIG. 1 is a block diagram illustrating a storage device in accordance with an embodiment of the present disclosure.

FIG. 1 is a block diagram illustrating a storage device 50 in accordance with an embodiment of the present disclosure.

Referring to FIG. 1, the storage device 50 may include a memory device 100 and a memory controller 200.

The storage device 50 may be configured to store data under control of a host 300 such as a cellular phone, a smartphone, an MP3 player, a laptop computer, a desktop computer, a game machine, a TV, a tablet PC, or an in-vehicle infotainment system.

The storage device 50 may be configured as any of various kinds of storage devices depending on a host interface, which is a communication system for communicating with the host 300. For example, the data storage device 50 may be configured as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and/or a memory stick.

The storage device 50 may be manufactured in the form of any of various package types. For instance, the storage device 50 may be manufactured as a package on package (POP) type, a system in package (SIP) type, a system on chip (SOC) type, a multi-chip package (MCP) type, a chip on board (COB) type, a wafer-level fabricated package (WFP) type, and/or a wafer-level stack package (WSP) type.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. A plurality of memory cells may form a plurality of pages. In an embodiment, each page may be the unit of storing data in the memory device 100 or reading stored data from the memory device 100. Each memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). In this specification, by way of example, the present invention is described in the context in which the memory device 100 is a NAND flash memory.

The memory device 100 may be implemented in a two-dimensional array structure or a three-dimensional array structure. The present invention is not limited to any particular structure of the memory device; any suitable structure consistent with the teachings herein may be employed. The present disclosure may be applied not only to a flash memory in which a charge storage layer is formed of a conductive floating gate (FG), but also to a charge trap flash (CTF) memory in which a charge storage layer is formed of an insulating layer.

In an embodiment, the memory device 100 may be operated in a single-level cell (SLC) manner of storing one data bit in each memory cell. Alternatively, the memory device 100 may be operated in a manner of storing at least two data bits in each memory cell. For example, the memory device 100 may be operated in a multi-level cell (MLC) manner of storing two data bits in each memory cell, a triple-level cell (TLC) manner of storing three data bits in each memory cell, or a quad-level cell (QLC) manner of storing four data bits in each memory cell.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a write (program) operation, a read operation, or an erase operation, in response to a received command. For example, when a program command is received, the memory device 100 may program data in an area selected by an address. If a read command is received, the memory device 100 may read data from an area selected by an address. If an erase command is received, the memory device 100 may erase data from an area selected by an address.

The memory device 100 may include a read data generator 150. The read data generator 150 may generate new read data obtained by adding additional data to data output from the memory cell array configured to store data. In other words, the new read data may include not only data obtained by reading memory cells disposed in a specific area but also other data. The additional data included in the new read data may include status information (ready/busy information) of the memory device 100.

The memory device 100 may output the new read data to the memory controller 200 in response to a read command received from the memory controller 200. In other words, although a conventional memory device 100 outputs only read data corresponding to a read command from the memory controller 200, the memory device 100 in accordance with embodiments of the present disclosure may output, to the memory controller 200, the new read data obtained by adding the additional data to the read data.

The memory controller 200 may control overall operation of the storage device 50.

When a power supply voltage is applied to the storage device 50, the memory controller 200 may execute firmware (FW). In the case where the memory device 100 is a flash memory device, the memory controller 200 may execute firmware such as a flash translation layer (FTL) for controlling communication between the host 300 and the memory device 100.

In an embodiment, the memory controller 200 may include firmware which receives data and a logical block address (LBA) from the host 300, and translates the LBA into a physical block address (PBA) indicating addresses of memory cells in which data is to be stored, the memory cells being included in the memory device 100. The memory controller 200 may store, in a buffer memory, a logical-physical address mapping table indicating mapping relationship between logical block addresses LBA and physical block addresses PBA.

The memory controller 200 may control the memory device 100 to perform a program operation, a read operation, or an erase operation in response to a request from the host 300. For example, if a program request is received from the host 300, the memory controller 200 may change the program request into a program command, and provide the program command, a PBA, and data to the memory device 100. If a read request along with an LBA is received from the host 300, the memory controller 200 may change a read request into a read command, select a PBA corresponding to the LBA, and provide the read command and the PBA to the memory device 100. If an erase request along with an LBA is received from the host 300, the memory controller 200 may change the erase request into an erase command, select a PBA corresponding to the LBA, and provide the erase command and the PBA to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 to perform background operations such as a program operation for wear leveling, and a program operation for garbage collection.

The memory controller 200 may include a command generator 210. The command generator 210 may generate a command corresponding to a request received from the host 300. For example, the command generator 210 may generate a program command, a read command, or an erase command corresponding to a program request, a read request, or an erase request received from the host 300.

In an embodiment, the command generator 210 may determine a command to be output to the memory device 100 based on the status information of the memory device 100. For example, if, while the memory device 100 performs a read operation, status information indicating that the memory device 100 is in a busy status is received, the command generator 210 may output a status check command for checking the status of the memory device 100 rather than outputting a subsequent read command to the memory device 100. On the other hand, if status information indicating that the memory device 100 is in a ready status is received, the command generator 210 may output a subsequent read command to the memory device 100.

The memory controller 200 may include a status information determiner 220. The status information determiner 220 may determine the status of the memory device 100 based on the additional data included in the new read data received from the memory device 100. The additional data in the new read data may include information about the status of the memory device 100.

In an embodiment, the status information determiner 220 may determine the status of the memory device 100 and then output status information indicating the status of the memory device 100 to the command generator 210. The status information that is output from the status information determiner 220 may include information about whether the memory device 100 is in the ready status or the busy status.

In an embodiment, the status information that is output from the status information determiner 220 may include information about whether the memory device 100 is in a high-temperature status, a backup required status, or a recovery required status.

In an embodiment, the storage device 50 may further include a buffer memory (not illustrated). The memory controller 200 may control data exchange between the host 300 and the buffer memory. Alternatively, the memory controller 200 may temporarily store system data for controlling the memory device 100 in the buffer memory. For example, the memory controller 200 may temporarily store, to the buffer memory, data input from the host 300, and thereafter transmit the data temporarily stored in the buffer memory to the memory device 100.

In various embodiments, the buffer memory may be used as an operating memory or a cache memory of the memory controller 200. The buffer memory may store codes or commands to be executed by the memory controller 200. Alternatively, the buffer memory may store data to be processed by the memory controller 200.

In an embodiment, the buffer memory may be embodied using an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In various embodiments, the buffer memory may be external to the storage device 50. In this case, a volatile memory device external to the storage device 50 may perform the function of the buffer memory.

In an embodiment, the memory controller 200 may control two or more memory devices. In this case, the memory controller 200 may control the memory devices in an interleaving manner so as to enhance the operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multi-media card (MMC), embedded MMC (eMMC), dual in-line memory module (DIMM), registered DIMM (RDIMM), and/or load reduced DIMM (LRDIMM) communication methods.

Figure 2:
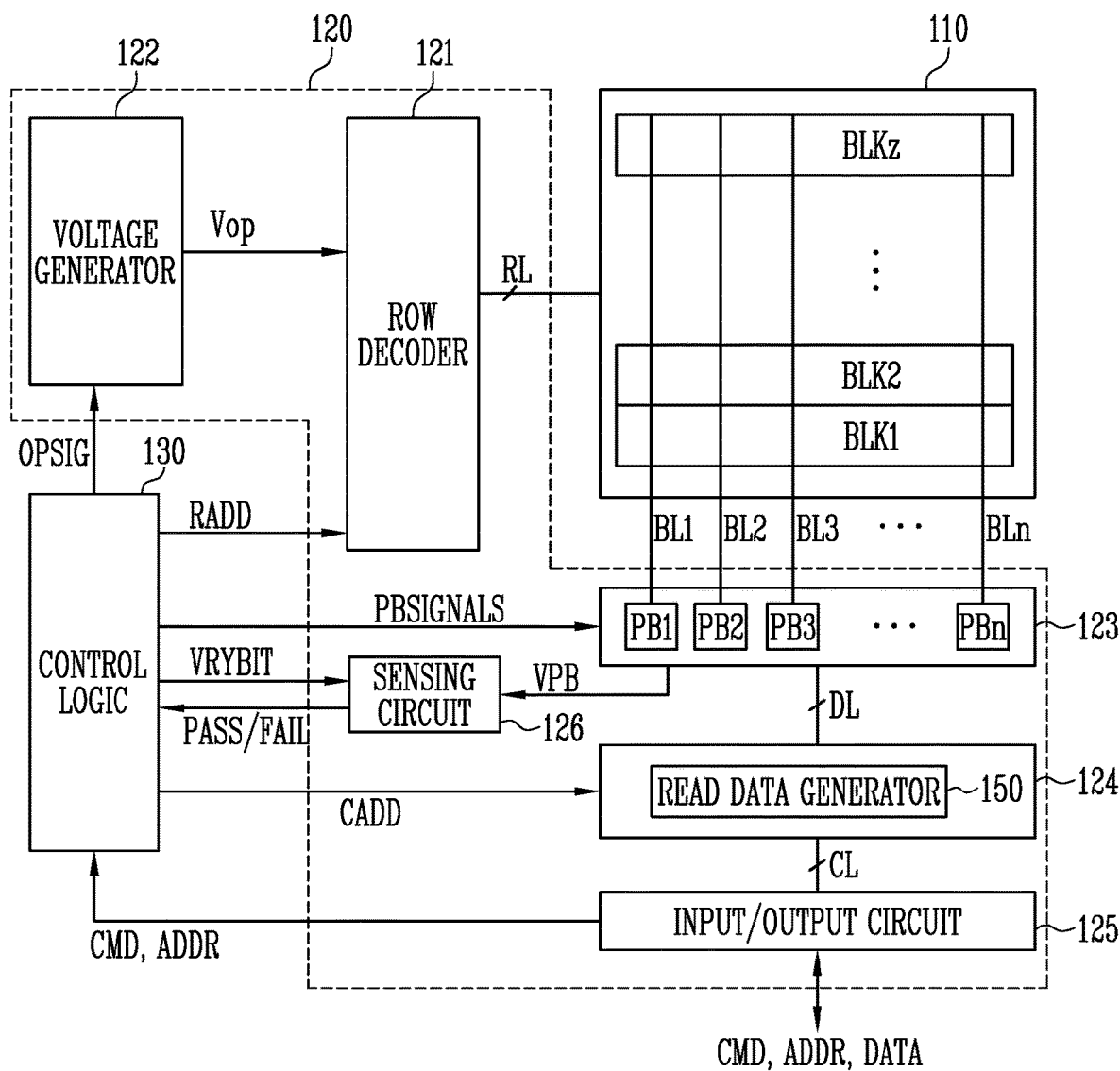
FIG. 2 is a diagram illustrating a configuration of a memory device, such as that of FIG. 1.

FIG. 2 is a diagram illustrating a configuration of a memory device of FIG. 1.

Referring to FIG. 2, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz are coupled to a row decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as one page. Hence, each memory block may include a plurality of pages.

The row lines RL may include at least one source select line, a plurality of word lines, and at least one drain select line.

Each of the memory cells included in the memory cell array 110 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row liens RL and the bit lines BL1 to BLn or discharge the applied voltages, under control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 may select at least one memory block of the memory blocks BLK1 to BLKz in response to the decoded address. The row decoder 121 may select at least one word line WL of the selected memory block in response to the decoded address so that voltages generated from the voltage generator 122 are applied to the at least one word line WL.

For example, during a program operation, the row decoder 121 may apply a program voltage to a selected word line and apply a program pass voltage that is lower than the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, an erase operation of the memory device 100 may be performed on a memory block basis. During an erase operation, the row decoder 121 may select one memory block in response to a decoded address. During the erase operation, the row decoder 121 may apply a ground voltage to word lines coupled to the selected memory block.

The voltage generator 122 may operate under control of the control logic 130. The voltage generator 122 may generate a plurality of voltages using an external supply voltage supplied to the memory device 100. In detail, the voltage generator 122 may generate various operating voltages Vop to be used for a program operation, a read operation, and an erase operation in response to an operating signal OPSIG. For example, the voltage generator 122 may generate a program voltage, a verify voltage, a pass voltage, a read voltage, an erase voltage, and any other voltages for operation under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using an external power supply voltage or an internal power supply voltage.

For example, the voltage generator 122 may include a plurality of pumping capacitors for receiving the internal supply voltage and generate a plurality of voltages by selectively activating the plurality of pumping capacitors under control of the control logic 130.

The generated voltages may be supplied to the memory cell array 110 by the row decoder 121.

The page buffer group 123 may include first to n-th page buffers PB1 to PBn, which are coupled to the memory cell array 110 through the first to n-th bit lines BL1 to BLn, respectively. The first to n-th page buffers PB1 to PBn may operate under control of the control logic 130. In detail, the first to n-th page buffers PB1 to PBn may operate in response to page buffer control signals PBSIGNALS. For instance, the first to n-th page buffers PB1 to PBn may temporarily store data received through the first to n-th bit lines BL1 to BLn, or sense voltages or currents of the first to n-th bit lines BL1 to BLn during a read operation or a verify operation.

In detail, during a program operation, the first to n-th page buffers PB1 to PBn may transmit data DATA received through the input/output circuit 125 to selected memory cells through the first to n-th bit lines BL1 to BLn when a program voltage is applied to a selected word line. The memory cells in the selected page are programmed based on the transmitted data DATA. During a program verify operation, the first to n-th page buffers PB1 to PBn may read page data by sensing voltages or currents received from selected memory cells through the first to n-th bit lines BL1 to BLn.

During a read operation, the first to n-th page buffers PB1 to PBn may read data DATA from memory cells of a selected page through the first to n-th bit lines BL1 to BLn, and output the read data DATA to the input/output circuit 125 under control of the column decoder 124.

During an erase operation, the first to n-th page buffers PB1 to PBn may float the first to n-th bit lines BL1 to BLn or apply erase voltages thereto.

The column decoder 124 may transmit data between the input/output circuit 125 and the page buffer group 123 in response to a column address CADD. For example, the column decoder 124 may exchange data with the first to n-th page buffers PB1 to PBn through data lines DL or exchange data with the input/output circuit 125 through column lines CL.

The column decoder 124 may include a read data generator 150.

In an embodiment, during a read operation, the read data generator 150 may generate new read data including both data transmitted from the page buffer group 123 through the data lines DL and information about a current status of the memory device 100. In other words, the data generator 150 may generate new read data including information about the status of the memory device 100 in response to a read command received from the memory controller 200, and output the new read data to the memory controller 200.

The input/output circuit 125 may transmit, to the control logic 130, a command CMD or an address ADDR received from the memory controller 200 described with reference to FIG. 1, or may exchange data DATA with the column decoder 124.

During a read operation or a verify operation, the sensing circuit 126 may generate a reference current in response to an enable bit signal VRYBIT, and may compare a sensing voltage VPB received from the page buffer group 123 with a reference voltage generated by the reference current and output a pass signal PASS or a fail signal FAIL.

The control logic 130 may output an operating signal OPSIG, a row address RADD, page buffer control signals PBSIGNALS, and an enable bit signal VRYBIT in response to a command CMD and an address ADD, and thus control the peripheral circuit 120. For example, the control logic 130 may control a read operation of a selected memory block in response to a sub-block read command and an address. Furthermore, the control logic 130 may control an erase operation of a selected sub-block included in a selected memory block, in response to a sub-block erase command and an address. In addition, the control logic 130 may determine whether a target memory cell has passed a verification during a verify operation in response to a pass signal PASS or a fail signal FAIL.

Each of the memory cells included in the memory cell array 110 may be programmed to any one programmed status among a plurality of programmed statuses depending on data to be stored in the corresponding memory cell. A target programmed status of a memory cell may be determined to be any one of the plurality of programmed statuses depending on data to be stored therein.

Figure 3:
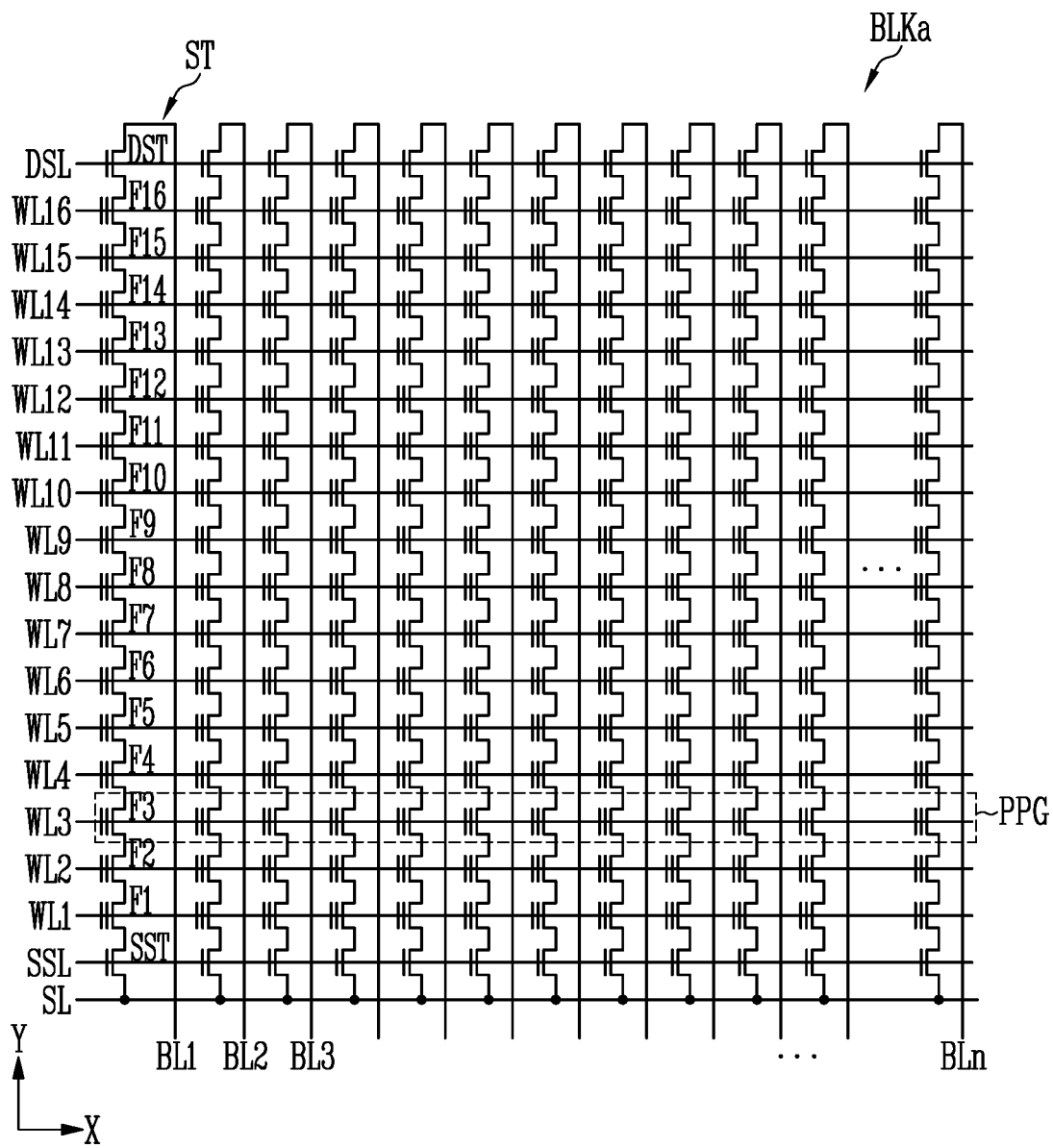
FIG. 3 is a diagram illustrating a memory block in accordance with an embodiment of the present disclosure.

FIG. 3 is a diagram illustrating a memory block in accordance with an embodiment of the present disclosure.

FIG. 3 is a circuit diagram illustrating a representative memory block BLKa of the plurality of memory blocks BLK1 to BLKz included in the memory cell array 110 of FIG. 2.

The memory block BLKa may be coupled with a first select line, word lines, and a second select line which are arranged parallel to each other. For example, the word lines may be arranged parallel to each other between the first and second select lines. Here, the first select line may be a source select line SSL, and the second select line may be a drain select line DSL.

In more detail, the memory block BLKa may include a plurality of strings coupled between the bit lines BL1 to BLn and the source line SL. The bit lines BL1 to BLn may be respectively coupled to the strings, and the source lines SL may be coupled in common to the strings. The strings may have the same configuration; therefore, the string ST that is coupled to the first bit line BL1 is described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors included in different strings may be coupled to the source select line SSL, gates of the drain select transistors may be coupled to the drain select line DSL, and gates of the memory cells F1 to F16 may be coupled to the plurality of word lines WL1 to WL16. Among the memory cells included in different strings, a group of memory cells coupled to each word line may be referred to as a physical page PPG. Therefore, the number of physical pages included in the memory block BLKa may correspond to the number of word lines WL1 to WL16.

Each memory cell may store 1-bit data. This memory cell is typically called a single level cell (SLC). In this case, each physical page PPG may store data of a single logical page LPG. Data of each logical page LPG may include data bits corresponding to the number of memory cells included in a single physical page PPG. Furthermore, each memory cell may store 2- or more-bit data. This memory cell is typically called a multi-level cell (MLC). In this case, each physical page PPG may store data of two or more logical pages LPG.

While an MLC generally refers to a memory cell capable of storing 2- or more-bit data, to distinguish between the various higher capacity cells, in a more specific sense the term "MLC" refers to a memory cell capable of 2-bit data, while a memory cell capable of storing 3- or more-bit data is called a triple level cell (TLC), and a memory cell capable of storing 4- or more-bit data is called a quadruple level cell (QLC). Embodiments of the present disclosure may be applied to a memory system in which 2- or more-bit data are stored in each memory cell.

In an embodiment, each memory block may have a three-dimensional structure. Each memory block may include a plurality of memory cells stacked on a substrate. The memory cells are arranged in a +X direction, a +Y direction, and a +Z direction.

Figure 4:
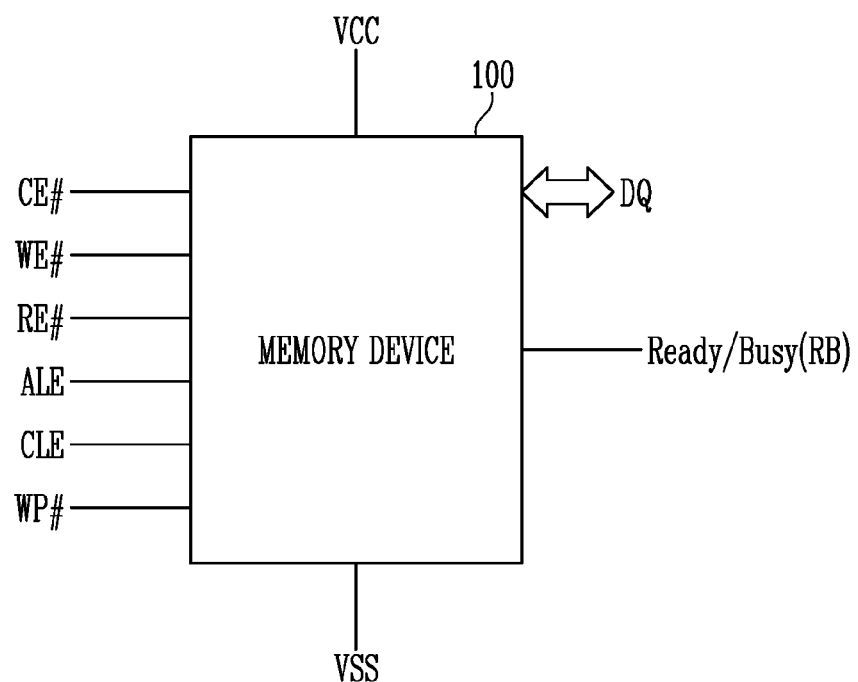
FIG. 4 is a diagram illustrating a pin configuration of a memory device, such as that of FIG. 1.

FIG. 4 is a diagram illustrating a pin configuration of the memory device 100 of FIG. 1.

Referring to FIG. 4, the memory device 100 may communicate with an external controller through a plurality of input/output lines. For example, the memory device 100 may communicate with the external controller through data input/output lines DQ, and control signal lines including a chip enable line CE #, a write enable line WE #, a read enable line RE #, an address latch enable line ALE, a command latch enable line CLE, a write prohibit line WP #, and a ready/busy line RB.

The memory device may receive a chip enable signal from the external controller through the chip enable line CE #. The memory device may receive a write enable signal from the external controller through the write enable line WE #. The memory device may receive a read enable signal from the external controller through the read enable line RE #. The memory device may receive an address latch enable signal from the external controller through the address latch enable line ALE. The memory device may receive a command latch enable signal from the external controller through the command latch enable line CLE. The memory device may receive a write prohibit signal from the external controller through the write prohibit line WP #.

In an embodiment, the memory device 100 may output a ready/busy signal indicating whether the memory device 100 is in a ready status or a busy status, to the memory controller through the ready/busy line RB.

The chip enable signal may be a control signal for selecting the memory device 100. If the chip enable signal is in a 'high' status and the memory device 100 is in a 'ready' status, the memory device 100 may enter a low power standby status.

The write enable signal may be a control signal for controlling an operation of storing, in a latch, a command, an address, and input data to be inputted to the memory device.

The read enable signal may be a control signal for enabling output of serial data.

The address latch enable signal may be one of control signals to be used by the host to indicate whether the type of signal to be inputted to the input/output lines DQ is a command, an address or data.

The command latch enable signal may be one of control signals to be used by the host to indicate whether the type of signal to be inputted to the input/output lines DQ is a command, an address or data.

For example, if the command latch enable signal is enabled (e. g., to a logic high level), the address latch enable signal is disabled (e.g., to a logic low level), and the write enable signal is enabled (e.g., to a logic low level) and thereafter disabled (e.g., to a logic high level), the memory device 100 may recognize that the signal inputted through the input/output lines DQ is a command.

For example, if the command latch enable signal is disabled (e. g., to a logic low level), the address latch enable signal is enabled (e.g., to a logic high level), and the write enable signal is enabled (e.g., to the logic low level) and thereafter disabled (e.g., to the logic high level), the memory device 100 may recognize that the signal inputted through the input/output lines DQ is an address.

The write prohibit signal may be a control signal for prohibiting the memory device 100 from performing a program operation or an erase operation.

The ready/busy signal may a signal for indicating the status of the memory device 100. A ready/busy signal having a low status (i.e., low level) may indicate that the memory device 100 is in a busy status, in other words, is performing at least one operation. A ready/busy signal having a high status (i.e., high level) may indicate that the memory device 100 is in a ready status, in other words, can receive a command because it is not performing an operation.

While the memory device 100 performs any one of a program operation, a read operation, and an erase operation, the ready/busy signal may be in a low status. In an embodiment of the present disclosure, the memory controller 200 described with reference to FIG. 1 may determine, based on the ready/busy signal, an operation end time at which a program operation or an erase operation is terminated.

Figure 5:
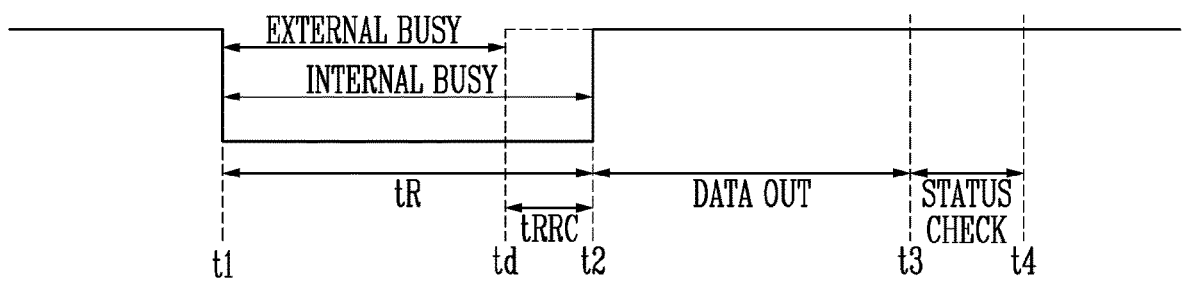
FIG. 5 is a diagram for describing a signal that is output through a ready/busy line based on an operation that is performed by a memory device.

FIG. 5 is a diagram for describing a signal that is output through the ready/busy line based on an operation which is performed by the memory device.

FIG. 5 illustrates a ready/busy signal which is output through the ready/busy line RB of FIG. 4 according to an operation that is performed by the memory device 100. A ready/busy signal having a high status may indicate that the memory device 100 is in a ready status. A ready/busy signal having a low status may indicate that the memory device 100 is in a busy status.

In FIG. 5, it is assumed that the operation that is performed by the memory device 100 is a read operation. Hence, t1 to t4 may indicate the time it takes to perform the read operation.

In an embodiment, before t1, the memory device 100 may not be operated. Therefore, a ready/busy signal which is output from the memory device 100 may be in a high status.

However, if the memory device 100 starts a read operation, the ready/busy signal output from the memory device 100 may be in a low status. In other words, at t1, the memory device 100 may start the read operation, and the ready/busy signal output from the memory device 100 may be in the low status.

After the read operation starts, data stored in the memory cell array 110 may be transmitted to the page buffer group 123 during a period from t1 to td, and a word line may be discharged during a period from td to t2, i.e., during period tRRC. Here, the read time tR may include the time from t1 to td for which the data stored in the memory cell array 110 is transmitted to the page buffer group 123 and a word line discharge time (tRRC).

In an embodiment, after the data stored in the memory cell array 110 is transmitted to the page buffer group 123 and the word line discharge is completed, a ready/busy signal output from the memory device 100 may be in a high status. In other words, the memory device 100 that has been in an internally busy status INTERNAL BUSY before the word line discharge is completed may enter an internally ready status after the word line discharge is completed. If the memory device 100 enters the internally ready status, a ready/busy signal having the high status may be output again.

However, from an external perspective, the memory device 100 may be in a busy status (EXTERNAL BUSY) only before the word line discharge. In other words, since discharging the word line is not directly related to outputting the read data, the discharging time may be excluded from the read time. When seen from the outside, the memory device may be in the busy status only before the word line discharge.

Therefore, in FIG. 5, only during the period from t1 to td (obtained by subtracting the word line discharge time from the read time tR), the memory device 100 may be in the busy status (EXTERNAL BUSY). During the word line discharge, the memory device 100 may be in the ready status. In other words, only when the memory device 100 transmits data stored in the memory cell array 110 to the page buffer group 123 may the memory device 100 be in the busy status. The reason for this is because the word line discharge time is not the time it takes to output the data stored in the memory cell array 110. Furthermore, the reason for this is because the word line discharge and the output of the data may be performed at the same time.

Therefore, if the operation of transmitting the data to the page buffer group 123 is completed, the memory device 100 may enter the externally ready status.

In an embodiment, if the word line discharge is completed, during the period from t2 to t3, the memory device 100 may output, to the memory controller 200, the data transmitted from the memory cell array 110 to the page buffer group 123 (as indicated by DATA OUT). While the memory device 100 outputs data to the memory controller 200, the memory device 100 may be in the ready status, and a ready/busy signal having the high status may be output.

After the output of the data is completed, during a period from t3 to t4, the memory device 100 may receive a status check command from the memory controller 200 and perform a status check operation STATUS CHECK corresponding to the status check command. The status check operation may be an operation of checking whether the memory device 100 is in the busy status or the ready status.

During the status check operation, the memory controller 200 may determine the status of the memory device 100 and then determine whether to output a subsequent command. In an embodiment, if the memory device 100 is in the ready status, the memory controller 200 may output a command for performing a subsequent operation to the memory device 100. If the memory device 100 is in the busy status, the memory controller 200 may check the status of the memory device 100 by outputting the status check command to the memory device 100 until the memory device 100 enters the ready status.

Figure 6:
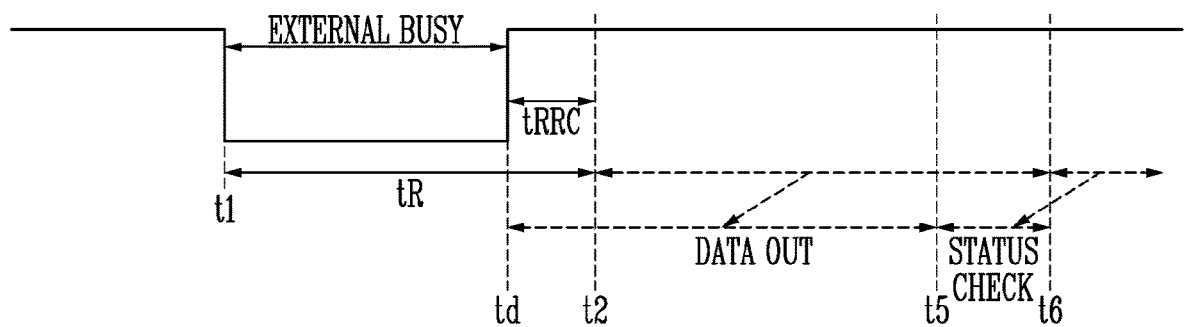
FIG. 6 is a diagram for describing an embodiment to reduce the time it takes to perform a read operation.

FIG. 6 is a diagram for describing an embodiment to reduce the time it takes to perform a read operation.

Terms and time periods of FIG. 6 that are the same as those of FIG. are not described again here. Rather, the description of FIG. 6 focuses on differences including changes in data output time and status check operation time.

In an embodiment, the memory device 100 may be in an externally busy status (EXTERNAL BUSY) during a period from t1 to td. In other words, only until transfer of data from the memory cell array 110 to the page buffer group 123 is completed, the memory device 100 may be in the busy status. After time td, the memory device 100 may be in the ready status. Therefore, a ready/busy signal which is output from the memory device 100 may be in a low status during the period from t1 to td and in a high status after time td.

In an embodiment, since the word line discharge and the data output of the memory device 100 are performed at the same time, the word line discharge and the data output may be simultaneously performed at time td. Therefore, although in the embodiment described with reference to FIG. 5 the data output starts at time t2 at which the word line discharge is completed, the data output in the embodiment of FIG. 6 may be performed at time td at which the word line discharge starts. As the time at which data is output is advanced, the time at which the status check operation STATUS CHECK is performed may also be advanced.

Consequently, the time at which the data output starts is advanced from t2 to td, and the time at which the status check operation is performed is also advanced, whereby the time it takes to perform the read operation may be reduced. Here, the reduced time may correspond to the time it takes to perform the word line discharge, in other words, the time corresponding to tRRC.

To reduce the time it takes to perform the read operation, not only the method in which the data output time is advanced but also a method in which data output time is reduced may be used. The reduction in the data output time may be a reduction in the time it takes to perform the data output operation and the status check operation.

The reduction in the data output time is described in more detail with reference to FIG. 7.

Figure 7:
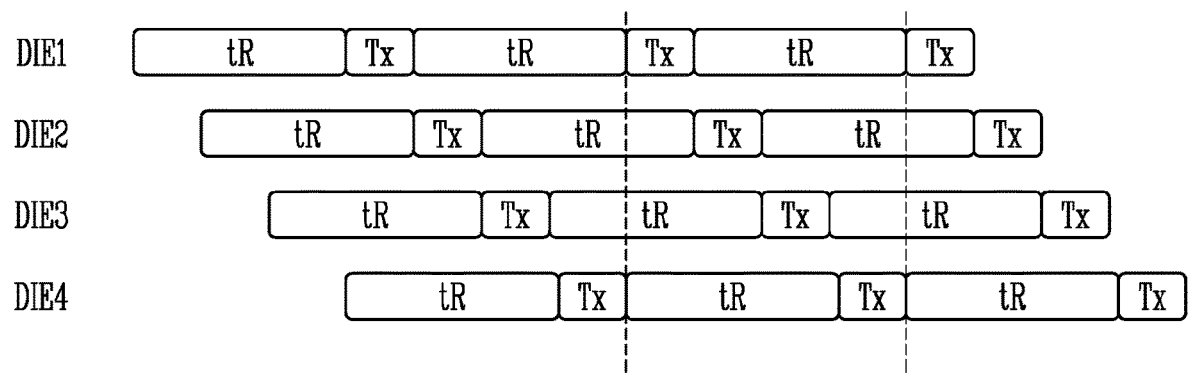
FIG. 7 is a diagram for describing effects resulting from the reduction in data output time during random read.

FIG. 7 is a diagram for describing effects resulting from the reduction in the data output time during random read.

FIG. 7 illustrates a read operation that is performed on a plurality of dies coupled to a single channel. In FIG. 7, it is assumed that the memory device 100 is coupled with the memory controller 200 through a plurality of channels, and first to fourth dies DIE1 to DIE4 illustrated in FIG. 7 are dies coupled to any one channel of the plurality of channels. In an embodiment, the number of dies coupled to each channel may be increased or reduced. In the present embodiment of FIG. 7, each die may be defined as being the same as a single memory device.

In FIG. 7, it is assumed that an operation that is performed on the memory device 100 is a random read operation. In addition, it is assumed that tR is the time it takes to transmit data from the memory cell array 110 to the page buffer group 123, and Tx is the data output time including both the time it takes to output data transmitted to the page buffer group 123 to the memory controller 200 and the time it takes to check the status of the memory device 100.

In an embodiment, the memory controller 200 may control the first to fourth dies DIE1 to DIE4 such that read operations on the first to fourth dies DIE1 to DIE4 sequentially start in a sequence from the first die DIE1 to the fourth die DIE4.

For example, data may be transmitted from a memory cell array 110 included in the first die DIE1 to the page buffer group 123, and then the data transmitted to the page buffer group 123 may be output to the memory controller 200.

In an embodiment, when output of data from any one die is terminated, output of data from another die may start.

For example, operations of transmitting data from the memory cell arrays 110 respectively included in the first die DIE1 and the second die DIE2 to the page buffer group 123 may be performed at the same time. However, during a data output operation, output of data from the second die may start after output of data from the first die DIE1 has been completed.

However, since the read operation described with reference to FIG. 7 is a random read operation, the data output time Tx thereof may be shorter than that of a sequential read operation in which large pieces of data are sequentially output. Therefore, while the data of the first die DIE1 is output, data stored in the memory cell array 110 of the second die DIE2 may be transmitted to the page buffer group 123.

In other words, even if the data output time Tx of the first die DIE1 is reduced, the time it takes to perform the read operation may not be significantly reduced because it takes a lot of time to transmit data from the memory cell array 110 of the second die to the page buffer group 123.

Figure 8:
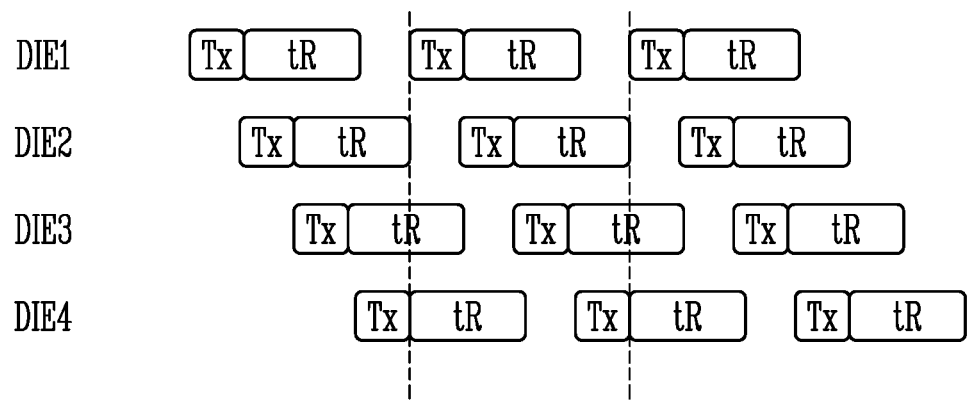
FIG. 8 is a diagram for describing effects resulting from the reduction in data output time during sequential read and random read.

FIG. 8 is a diagram for describing effects resulting from the reduction in the data output time during sequential read and random read.

Referring to FIGS. 7 and 8, FIG. 8 illustrates a read operation that is performed on a plurality of dies coupled to a single channel in the same manner as that of FIG. 7. However, unlike FIG. 7, FIG. 8 illustrates a sequential read operation or a random read operation when the number of dies coupled to a single channel is relatively large. In other words, FIG. 8 illustrates the time it takes to perform the read operation when the data output time Tx of all the dies coupled to the single channel is relatively long.

In FIG. 8, it is assumed that tR is the time it takes to transmit data from the memory cell array 110 to the page buffer group 123, and Tx is the data output time including both the time it takes to output data transmitted to the page buffer group 123 to the memory controller 200 and the time it takes to check the status of the memory device 100.

In the following description with reference to FIG. 8, content already described with reference to FIG. 7 is not described again.

In an embodiment, data of the first die DIE1 may be output. Thereafter, if all pieces of data of the first die DIE1 are output, data of the second die DIE2 may be output. In detail, data of the first to fourth dies DIE1 to DIE4 may be sequentially output.

After the data of the first die DIE1 is output, data may be transmitted from the memory cell array 110 of the first die DIE1 to the page buffer group 123 again. However, the data transmitted to the page buffer group 123 may be output after all pieces of data of the fourth die DIE4 are output, rather than being directly output. Therefore, in this case, if the data output time is reduced, the entire time it takes to perform the read operation may be rapidly reduced.

Figure 9:
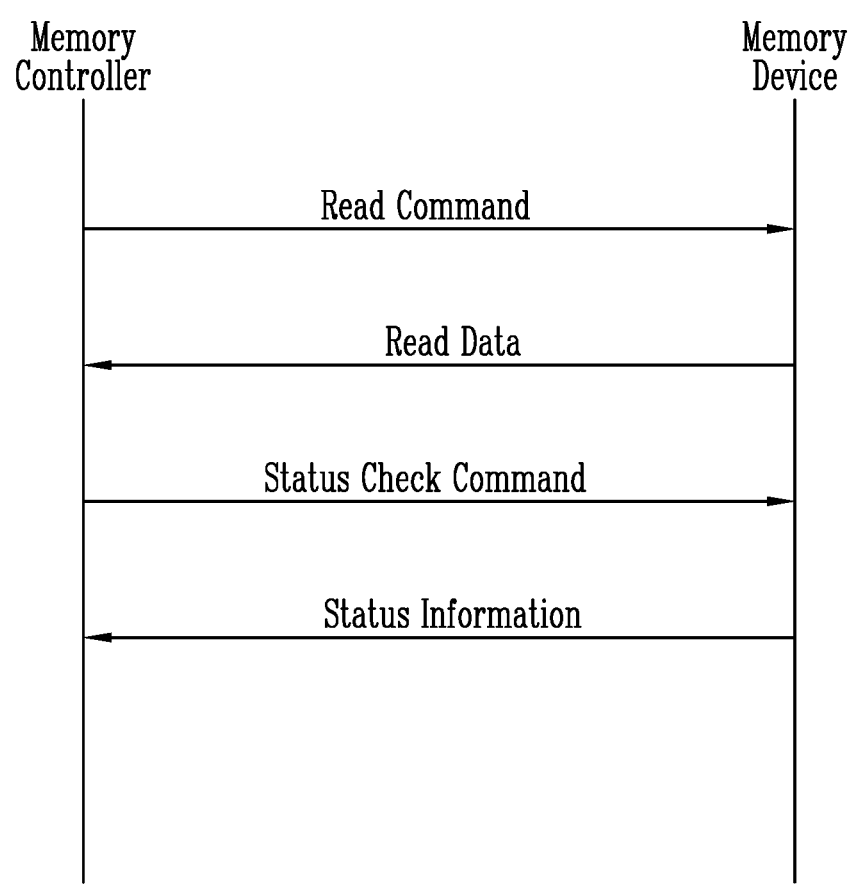
FIG. 9 is a diagram for describing a method of communication between a memory controller and a memory device during a conventional read operation.

FIG. 9 is a diagram for describing a method of communication between a memory controller and a memory device during a conventional read operation.

FIG. 9 illustrates the conventional read operation that is performed by a storage device in response to a read request from a host. The storage device may include the memory controller and the memory device.

The memory controller may receive a read request from the host, and output a read command to the memory device in response to the read request. The memory device may perform a read operation corresponding to the read command received from the memory controller.

For example, the memory device 100 may read, from a memory cell array, data corresponding to an address received along with the read command, and output the read data to the memory controller.

The memory controller may receive read data from the memory device and then check the status of the memory device to execute a subsequent read command of the memory device. The command that is output from the memory controller to check the status of the memory device may be a status check command.

Thereafter, the memory device may perform a status check operation corresponding to the status check command. The status check operation may be an operation of outputting status information stored in a status register provided in the memory device.

The memory controller may receive the status information corresponding to the status check command and check the status of the memory device.

For example, the memory controller may determine whether the memory device is in the ready status or the busy status based on the status information. The memory controller may determine whether the memory device is in a high-temperature status, a backup required status, or a recovery required status, based on the status information.

As described above, during the conventional read operation, the memory controller receives the read data corresponding to the read command and thereafter outputs, to the memory device, the separate status check command for checking the status of the memory device.

However, because of the operation of outputting by the memory controller the status check command for checking the status of the memory device and checking the status of the memory device, the overall efficiency of the read operation may be reduced.

Therefore, the present disclosure proposes a method in which the status information is included as additional data in the read data so as to increase the efficiency of the read operation by skipping the operation of outputting the status check command to the memory device 100.

Figure 10:
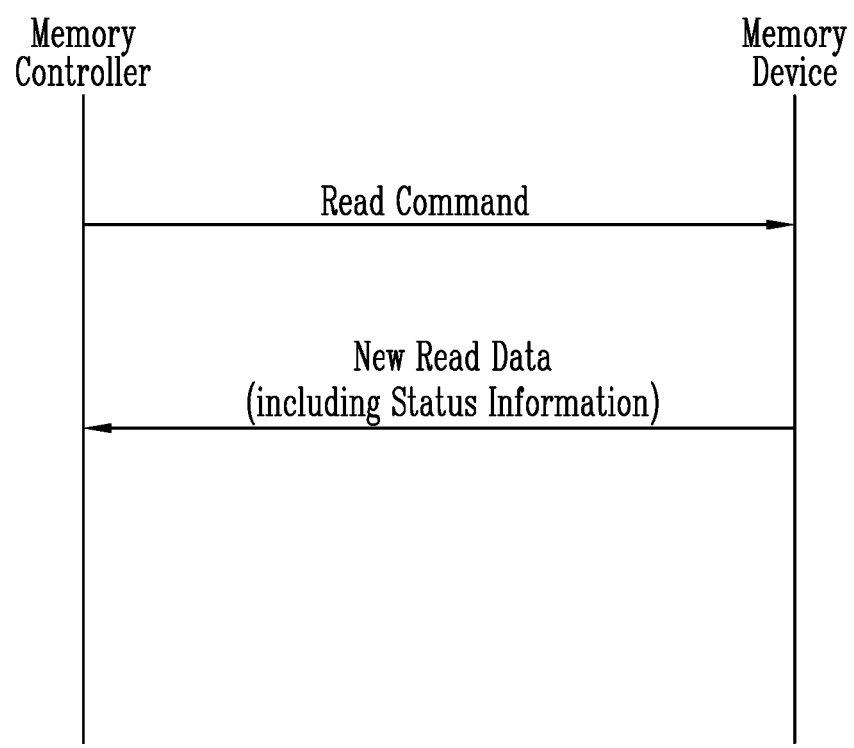
FIG. 10 is a diagram for describing a method of communication between a memory controller and a memory device during a read operation in accordance with the present disclosure.

FIG. 10 is a diagram for describing a method of communication between the memory controller and the memory device during a read operation in accordance with the present disclosure.

FIG. 10 illustrates a read operation that is performed by the storage device 50 in response to a read request from the host 300 in accordance with an embodiment of the present disclosure. The storage device 50 may include the memory controller 200 and the memory device 100.

In an embodiment, the memory controller 200 may receive a read request from the host 300, and output a read command to the memory device 100 in response to the read request. The memory device 100 may perform a read operation corresponding to the read command received from the memory controller 200. For example, the memory device 100 may read, from the memory cell array 110, data corresponding to an address received along with the read command, and output the read data to the memory controller 200.

However, unlike the case of FIG. 9, the memory device 100 of FIG. may output, to the memory controller 200, new read data including both read data that is read from the memory cell array 110 and status information indicating the status of the memory device 100. For a given output, the status information may include at least one among ready/busy status, high-temperature status, backup required status, and recovery required status of the memory device 100.

The memory controller 200 may receive the new read data from the memory device 100 and then check the status of the memory device 100 based on the status information.

For example, in the case where the status of the memory device 100 is in the ready status, the memory controller 200 may output, to the memory device 100, a subsequent command for performing a subsequent operation on the memory device 100. On the other hand, in the case where the status of the memory device 100 is in the busy status, the memory controller 200 may output a status check command to the memory device 100 until the status of the memory device 100 enters the ready status. Subsequently, if the memory device 100 enters the ready status, the memory controller 200 may output a subsequent command to the memory device 100.

Consequently, the memory controller 200 may check the status of the memory device 100 based on the new read data or the status information so as to perform a subsequent read command on the memory device 100.

Figure 11:
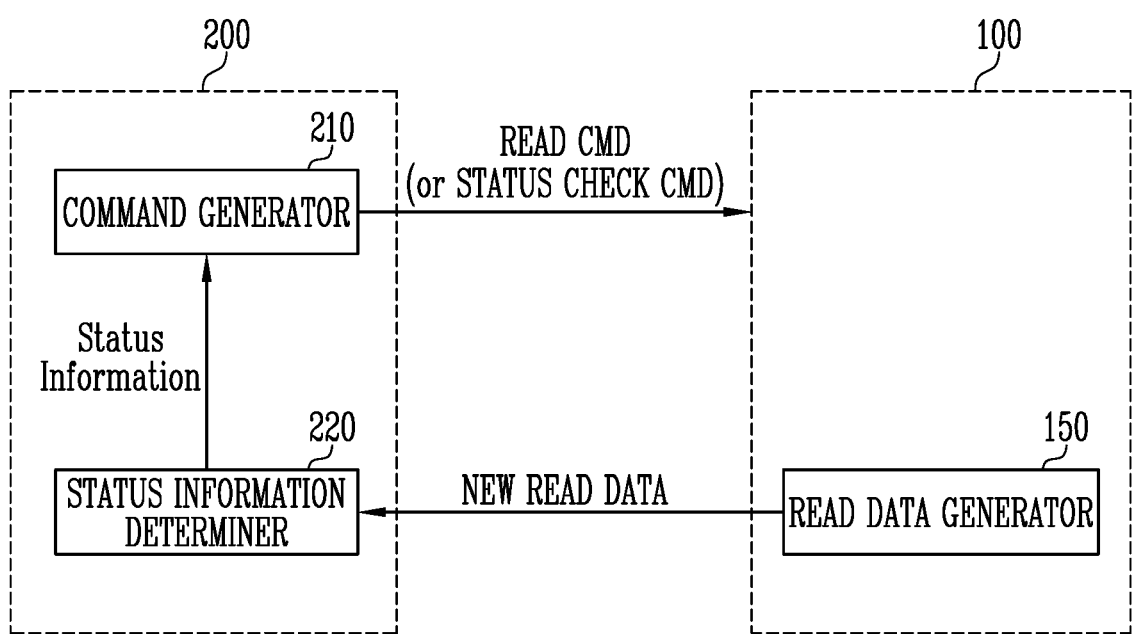
FIG. 11 is a diagram for describing an operation of a memory controller after an associated memory device has outputted new read data.

FIG. 11 is a diagram for describing an operation of the memory controller after the memory device has outputted new read data.

FIG. 11 illustrates output of new read data and an operation corresponding to the new read data in accordance with an embodiment of the present disclosure. The memory controller 200 of FIG. 11 may include the command generator 210 and the status information determiner 220. The memory device 100 may include the read data generator 150.

In an embodiment, the read data generator 150 may generate new read data in response to a read command READ CMD received from the memory controller 200. The new read data may include both read data that is read from the memory cell array 110 and status information indicating the status of the memory device 100. The read data generator 150 may output the new read data to the memory controller 200.

In an embodiment, the status information determiner 220 may receive the new read data output from the read data generator 150. Since the new read data includes the read data corresponding to the read command READ CMD and the status information indicating the status of the memory device 100, the status information determiner 220 may determine the status of the memory device 100 based on the new read data. The status information determiner 220 may determine the status of the memory device 100 and generate status information, and provide the status information to the command generator 210.

If the status information determiner 220 indicates that the memory device 100 is in the ready status, the memory device 100 is able to perform a subsequent read command READ CMD. Therefore, the status information determiner 220 may generate status information indicating that the memory device 100 can perform the subsequent read command READ CMD, and provide the status information to the command generator 210. The command generator 210 may output a subsequent read command READ CMD to the memory device 100 based on the status information received from the status information determiner 220.

However, if the status information determiner 220 indicates that the memory device 100 is in the busy status, the memory device 100 is not able to perform a subsequent read command READ CMD. Therefore, the status information determiner 220 may generate status information indicating that the memory device 100 cannot perform the subsequent read command READ CMD, and provide the status information to the command generator 210. The command generator 210 may output a status check command STATUS CHECK CMD to the memory device 100 until the memory device 100 enters the ready status, based on the status information received from the status information determiner 220.

Thereafter, the status information determiner 220 may receive status information corresponding to the status check command STATUS CHECK CMD from the memory device 100, and determine the status of the memory device 100 based on the status information. The status information determiner 220 may generate status information indicating that the memory device 100 is in the ready status or the busy status depending on the determined status of the memory device 100, and output the generated status information to the command generator 210. The command generator 210 may determine whether to output a status check command STATUS CHECK CMD again or output a subsequent read command READ CMD based on the status information, generate a command based on a result of the determining, and then output the generated command to the memory device 100.

Figure 12:
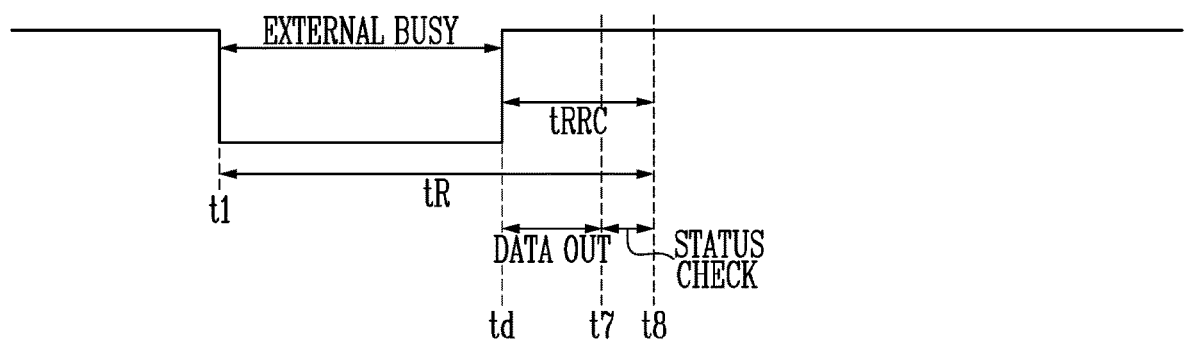
FIG. 12 is a diagram for describing status check of a memory device when data output is completed before word line discharge is completed.

FIG. 12 is a diagram for describing status check of the memory device when data output is completed before word line discharge is completed.

Referring to FIGS. 4, 6, and 12, FIG. 12 illustrates a ready/busy signal output through the ready/busy line RB when the data output is performed simultaneously with the word line discharge. Description of FIG. 12, other than the fact that the data output time DATA OUT is shorter than the word line discharge time tRRC, is the same as that of FIG. 6; therefore, common matter is omitted here.

In an embodiment, at time t1, the memory device 100 may start a read operation corresponding to a read command received from the memory controller 200, so that a ready/busy signal having a low state may be output. Thereafter, at time td, the memory device 100 may output, to the memory controller 200, data transmitted to the page buffer group 123 at the same time as the word line discharge. After time td, the memory device 100 is internally in the busy state (the word line discharge) but is externally in the ready state. Hence, a ready/busy signal having a high state may be output.

Unlike the case of FIG. 6, before the word line discharge is completed, the data output may be completed. In other words, although the word line discharge is performed during a period from td to t8, the data output may be performed during a comparatively short period from td to t7.

In an embodiment of the present disclosure, since the new read data corresponding to the read command includes the status information of the memory device 100, the new read data, the output of which is completed at time t7, may include status information indicating that the memory device 100 is in the busy status. In other words, because the memory device 100 is performing the word line discharge, the memory device 100 may be in the busy status.

Therefore, the status information determiner 220 may output status information indicating that the memory device 100 is in the busy status, based on the status information included in the new read data. The command generator 210 may output a status check command based on the status information received from the status information determiner 220. The memory device 100 may perform a status check operation STATUS CHECK in response to the status check command, and output status information that is a result of the performing to the memory controller 200.

During a period from t7 to t8, since the word line is being discharged, the status information that is output by the memory device 100 may include information indicating the busy status. Therefore, until the word line discharge is completed, the memory controller 200 may output the status check command to the memory device 100, and the memory device 100 may output the status information to the memory controller 200.

After time t8, if the status information that is output from the memory device 100 includes information indicating the ready status, the memory controller 200 may output a subsequent command to the memory device 100.

Figure 13:
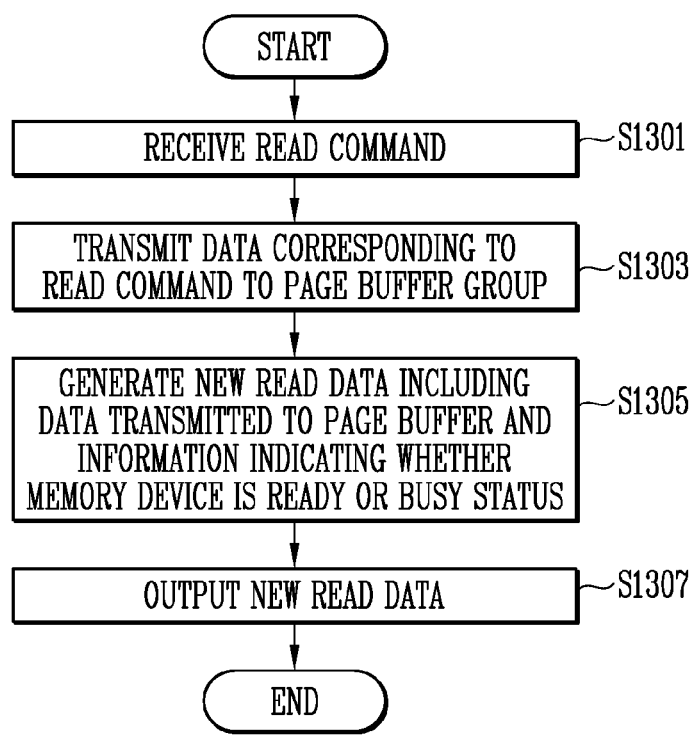
FIG. 13 is a diagram for describing an operation of a memory device in accordance with an embodiment of the present disclosure.

FIG. 13 is a diagram for describing an operation of the memory device in accordance with an embodiment of the present disclosure.

Referring to FIG. 13, at step S1301, the memory device may receive a read command from the memory controller. The read command may correspond to a read request received from the host. The memory device may perform a read operation corresponding to the received read command. The read operation may include an operation of reading data stored in the memory cell array, a word line discharge operation, and a data output operation.

At step S1303, the memory device may transmit, to the page buffer group, data corresponding to the read command among pieces of data stored in the memory cell array. If the data corresponding to the read command is transmitted to the page buffer group, the memory device may generate new read data including both the data transmitted to the page buffer group and information indicating whether the memory device is in a ready status or a busy status (at step S1305).

In other words, the memory device may generate the new read data including the read data and the status information of the memory device, and then output the generated new read data to the memory controller (at step S1307). The memory controller may check the status of the memory device based on the new read data output from the memory device and then determine a subsequent command to be output to the memory device.

Figure 14:
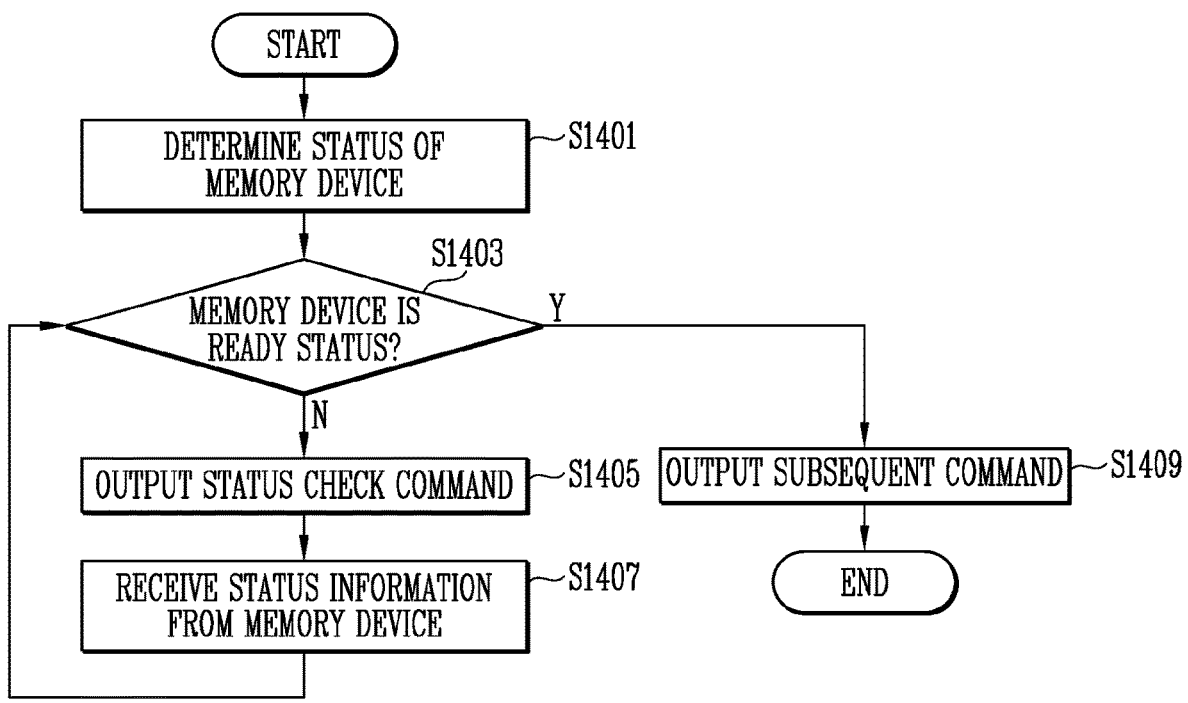
FIG. 14 is a diagram for describing an operation of a memory controller in accordance with an embodiment of the present disclosure.

FIG. 14 is a diagram for describing an operation of the memory controller in accordance with an embodiment of the present disclosure.

Referring to FIG. 14, at step S1401, the memory controller may determine the status of the memory device. The memory controller may determine the status of the memory device based on the status information included in the new read data received from the memory device. The status of the memory device may be either the ready status or the busy status. In an embodiment, the status of the memory device may be any one of various statuses including the ready status and the busy status.

At step S1403, the memory controller may determine whether the memory device is in the ready state, i.e., has a ready status. If the memory device is in the ready status (Y at S1403), the memory controller may output a subsequent command (at step S1409). The subsequent command may be a command other than a command of checking the status of the memory device.

However, if the memory device is in the busy status, in other words, if the memory device is not in the ready status (N at S1403), the memory controller may output a status check command for checking the status of the memory device again to the memory device (at step S1405). Since the memory device can perform a subsequent command when the memory device in the ready status, the memory controller may output the status check command to the memory device until the memory device enters the ready status.

Thereafter, the memory controller may receive status information corresponding to the status check command from the memory device (at step S1407). If the memory controller receives the status information, the memory controller may proceed to step S1403 again and determine whether the memory device is in the ready status based on the status information. If the memory device enters the ready status, the memory controller may suspend the output of the status check and then output a subsequent command for performing a subsequent operation.

Figure 15:
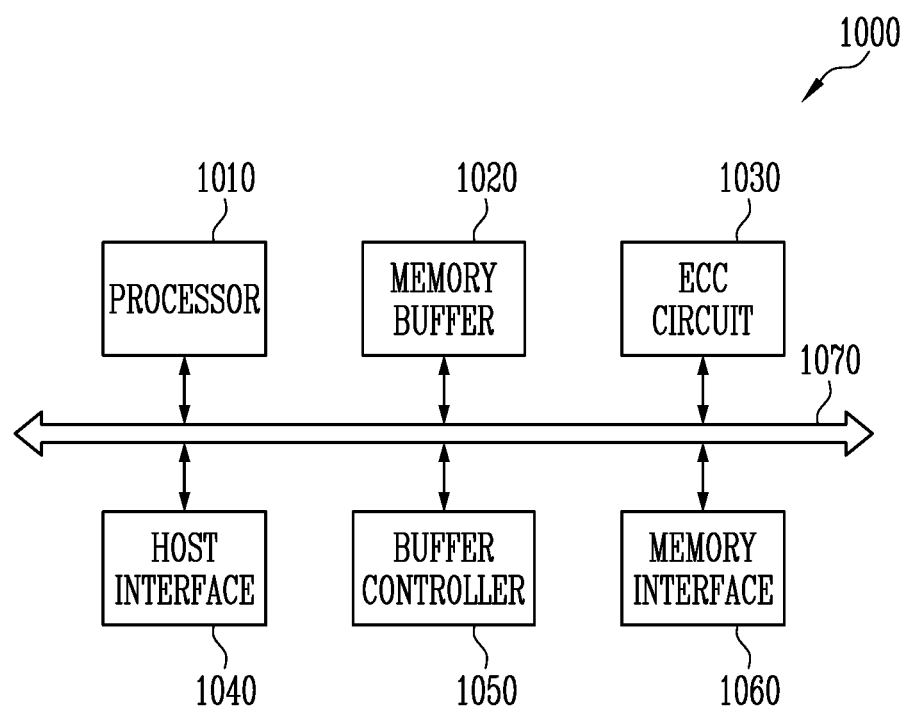
FIG. 15 is a diagram illustrating an example of the memory controller of FIG. 1.

FIG. 15 is a diagram illustrating an example of the memory controller of FIG. 1.

A memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 15, the memory controller 1000 may include a processor 1010, a memory buffer 1020, an error correction code (ECC) circuit 1030, a host interface 1040, a buffer controller 1050, a memory interface 1060, and a bus 1070.

The bus 1070 may provide a channel between the components of the memory controller 1000.

The processor 1010 may control overall operation of the memory controller 1000 and perform a logical operation. The processor 1010 may communicate with the external host through the host interface 1040 and communicate with the memory device through the memory interface 1060. In addition, the processor 1010 may communicate with the memory buffer 1020 through the buffer controller 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device to be stored, and may be programmed to the memory cell array.

The processor 1010 may drive software or firmware to perform the randomizing operation or the derandomizing operation.

In an embodiment, the processor 1010 may determine the status of the memory device 100 based on new read data received from the memory device 100. Since the new read data includes not only data stored in the memory device 100 but also information about the status of the memory device 100, the processor 1010 may determine the status of the memory device 100 based on the new read data.

In other words, since the new read data includes the status information of the memory device 100, the processor 1010 may not output the status check command to the memory device 100 when the memory device 100 is determined to be in the ready status. Therefore, the time it takes for the memory device 100 to perform the read operation may be reduced.

The processor 1010 may output, to the memory device 100, a subsequent read command or a status check command for checking the status of the memory device 100 based on the determined status of the memory device 100. In an embodiment, the processor 1010 may output the status check command to the memory device 100 until the memory device 100 enters the ready status.

The memory buffer 1020 may be used as a working memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multi-media card (MMC), an embedded MMC (eMMC), a dual in-line memory module (DIMM), a registered DIMM (RDIMM), and/or a load reduced DIMM (LRDIMM) communication methods.

The buffer controller 1050 may control the memory buffer 1020 under control of the processor 1010.

The memory interface 1060 may communicate with the memory device under control of the processor 1010. The memory interface 1060 may communicate a command, an address, and data with the memory device through the channel.

For example, the memory controller 1000 may include neither the memory buffer 1020 nor the buffer controller 1050.

For example, the processor 1010 may control the operation of the memory controller 1000 by using codes. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer controller 1050, the ECC circuit 1030, and the memory interface 1060. The control bus may be coupled to the host interface 1040, the processor 1010, the buffer controller 1050, the memory buffer 1020, and the memory interface 1060.

Figure 16:
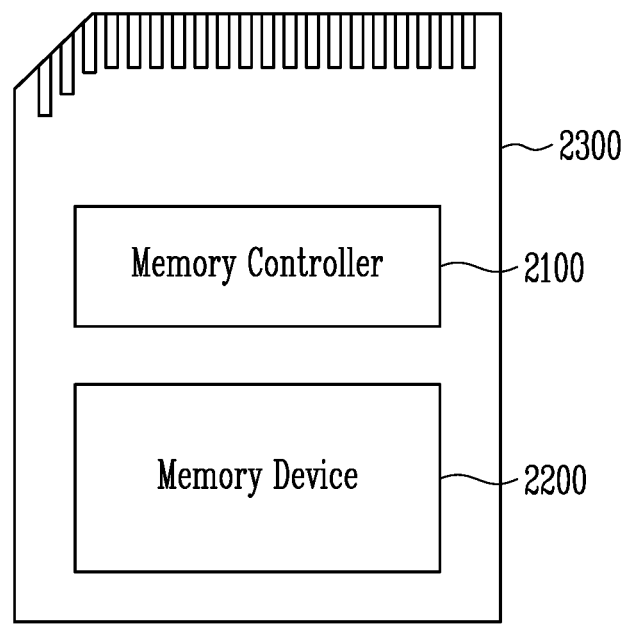
FIG. 16 is a block diagram illustrating a memory card system to which the storage device is applied in accordance with an embodiment of the present disclosure.

FIG. 16 is a block diagram illustrating a memory card system 2000 to which the storage device is applied in accordance with an embodiment of the present disclosure.

Referring FIG. 16, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200. The memory device 2200 may be embodied in the same manner as that of the memory device 100 described with reference to FIG. 2.

In an embodiment, the memory controller 2100 may include components such as a random access memory (RAM), a processor, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and/or nonvolatile memory express (NVMe) protocols. In an embodiment, the connector 2300 may be defined by at least one of the above-described various communication protocols.

In an embodiment, the memory controller 2100 may determine the status of the memory device 2200 based on new read data received from the memory device 2200. Since the new read data includes not only data stored in the memory device 2200 but also information about the status of the memory device 2200, the memory controller 2100 may determine the status of the memory device 2200 based on the new read data.

In other words, since the new read data includes the status information of the memory device 2200, the memory controller 2100 may not output a status check command to the memory device 2200 if the memory device 2200 is determined to be in the ready status. Therefore, the time it takes for the memory device 2200 to perform the read operation may be reduced.

The memory controller 2100 may output, to the memory device 2200, a subsequent read command or a status check command for checking the status of the memory device 2200 based on the determined status of the memory device 2200. In an embodiment, the memory controller 2100 may output the status check command to the memory device 2200 until the memory device 2200 enters the ready status.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-torque transfer magnetic RAM (STT-M RAM).

In an embodiment, the memory controller 2100 and the memory device 2200 may be integrated into a single semiconductor device to form a memory card, such as a personal computer memory card international association (PCM-CIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 17:
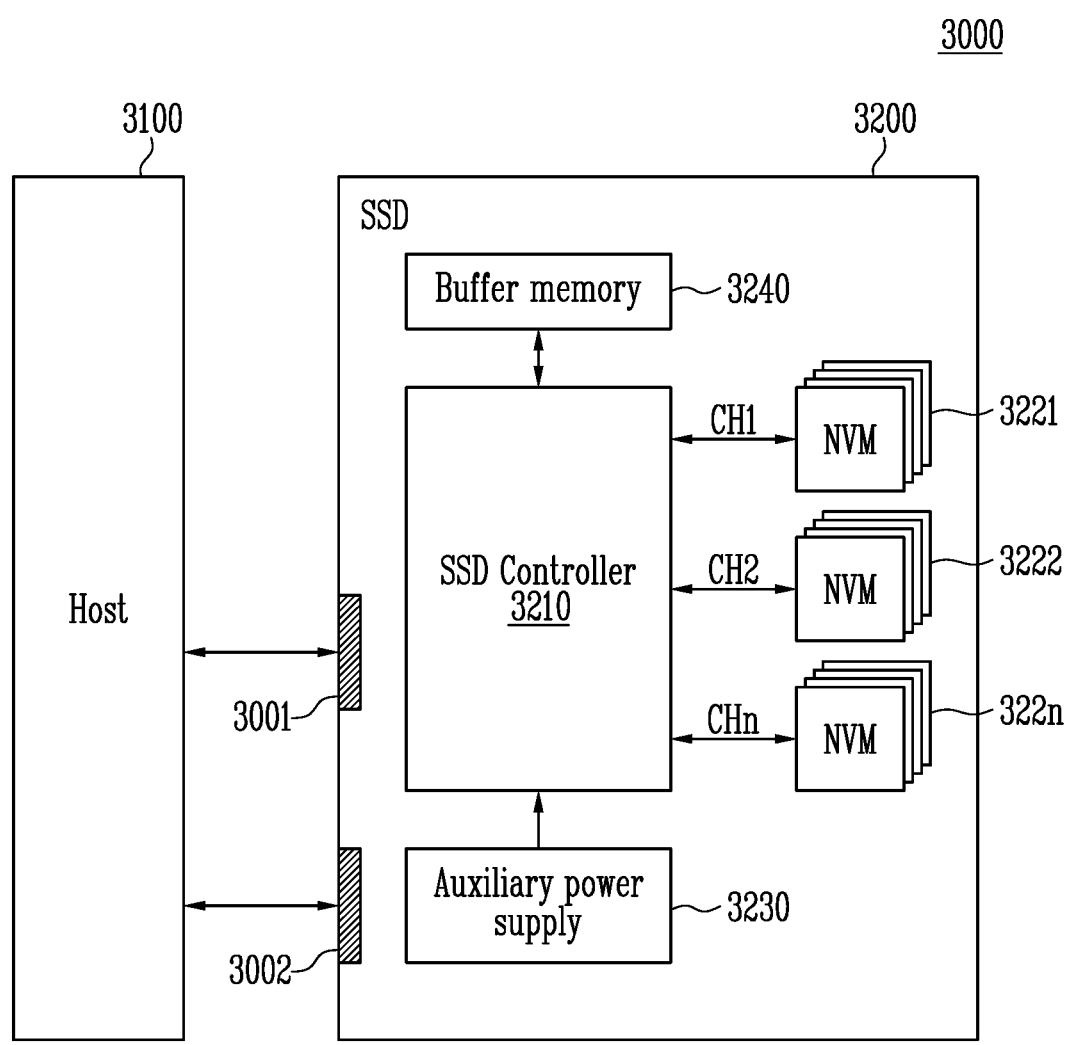
FIG. 17 is a block diagram illustrating a solid state drive (SSD) system to which the storage device is applied in accordance with an embodiment of the present disclosure.

FIG. 17 is a block diagram illustrating a solid state drive (SSD) system 3000 to which the storage device is applied in accordance with an embodiment of the present disclosure.

Referring to FIG. 17, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322*n*, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322*n* in response to the signals SIG received from the host 3100. In an embodiment, the signals SIG may be based on an interface between the host 3100 and the SSD 3200. For example, the signals SIG may be defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and/or nonvolatile memory express (NVMe) interfaces.

In an embodiment, the SSD controller 3210 may determine the status of each of the plurality of flash memories 3221 to 322*n* based on new read data received from the corresponding flash memory or memories. Since the new read data includes not only data stored in one or more of the plurality of flash memories 3221 to 322*n* but also information about the status(es) of the corresponding flash memory or memories, the SSD controller 3210 may determine the status(es) of those flash memory(ies) based on the new read data.

In other words, since the new read data include the information about the status(es) of the flash memory(ies) from which data is read, the SSD controller 3210 may not output the status check command to those flash memory (ies), which instead are determined to be in the ready status. Therefore, the time it takes for the plurality of flash memories 3221 to 322*n* to perform the read operation may be reduced.

The SSD controller 3210 may output, to any of the plurality of flash memories 3221 to 322n, a subsequent read command or a status check command for checking the statuses of the plurality of flash memories 3221 to 322n based on the determined statuses of the plurality of flash memories 3221 to 322n. In an embodiment, the SSD controller 3210 may output the status check command to the plurality of flash memories 3221 to 322n until the plurality of flash memories 3221 to 322n enter the ready status.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include any of various volatile memories such as DRAM, SDRAM, DDR SDRAM, LPDDR SDRAM, and GRAM or nonvolatile memories such as FRAM, ReRAM, STT-MRAM, and PRAM.

Figure 18:
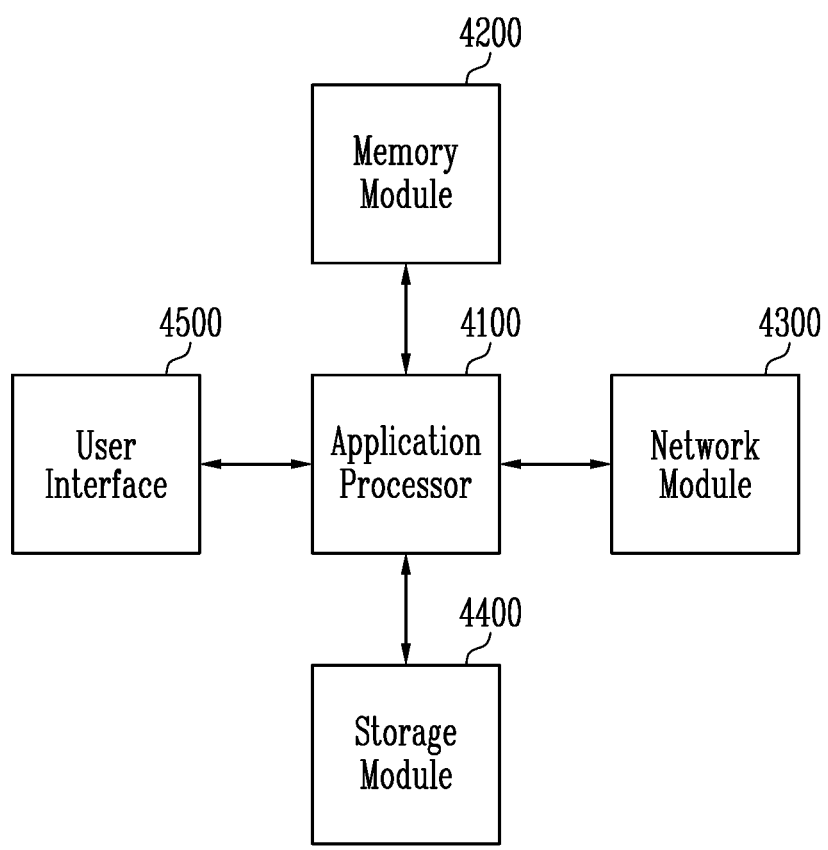
FIG. 18 is a block diagram illustrating a user system to which the storage device is applied in accordance with an embodiment of the present disclosure.

FIG. 18 is a block diagram illustrating a user system 4000 to which the storage device in accordance with an embodiment of the present disclosure is applied.

Referring to FIG. 18, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

In an embodiment, the application processor 4100 may determine the status of the storage module 4400 based on new read data received from the storage module 4400. Since the new read data includes not only data stored in the storage module 4400 but also information about the status of the storage module 4400, the application processor 4100 may determine the status of the storage module 4400 based on the new read data.

In other words, since the new read data includes the status information of the storage module 4400, the application processor 4100 may not output a status check command to the storage module 4400 if the status information received indicates that the storage module 4400 is in the ready status. Therefore, the time it takes for the storage module 4400 to perform the read operation may be reduced.

The application processor 4100 may output, to the storage module 4400, a subsequent read command or a status check command for checking the status of the storage module 4400 based on the determined status of the storage module 4400. In an embodiment, the application processor 4100 may output the status check command to the storage module 4400 until the storage module 4400 enters the ready status.

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and/or an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIGS. 2 and 3. The storage module 4400 may be operated in the same manner as that of the storage device 50 described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, a monitor, and the like.

In accordance with embodiments of the present disclosure, a memory device may output new read data including status information to the memory controller, and the memory controller may determine the status of the memory device based on the new read data and output a status check command or a subsequent command based on a result of determining the status.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A storage device, comprising:
a memory device configured to, in response to a reception of a read command, perform a read operation and to output new read data including read data obtained by the read operation and status information indicating a result of the read operation as a response to the read command; and
a memory controller configured to provide the read command, receive the new read data from the memory device and to provide a subsequent command according to the status information included in the new read data,
wherein the memory device outputs the new read data to the memory controller during the memory device performing word line discharge.

2. The storage device according to claim 1, wherein, when the status information indicating that the memory device is in a ready status, the subsequent command is a command corresponding to a request received from a host.

3. The storage device according to claim 1, wherein, when the status information indicating that the memory device is in a busy status, the subsequent command is a status check command for checking a status of the memory device.

4. The storage device according to claim 3, wherein the memory device outputs the status information corresponding to the status check command to the memory controller.

5. The storage device according to claim 4, wherein the memory controller outputs the status check command to the memory device until the status information indicating that the memory device is in a ready status is received.

6. The storage device according to claim 1, wherein, when the output of the new read data is completed before the word line discharge is completed, the memory controller outputs a status check command to the memory device until the word line discharge is completed.

7. The storage device according to claim 6, wherein, when the word line discharge is completed, the memory controller outputs the subsequent command to the memory device corresponding to a request received from a host.

8. A method of operating a storage device, comprising:
providing, by a memory controller of the storage device, a read command corresponding to a read request from a host to a memory device;
performing, by the memory device of the storage device, a read operation in response to the read command;
providing, by the memory device of the storage device, new read data including both data obtained by the read operation and first status information indicating a result of performing the read operation as a response to the read command to the memory controller, during the memory device performing a word line discharge;
providing, by the memory controller, a subsequent command to be performed by the memory device based on second status information acquired from the new read data to the memory device.

9. The method according to claim 8, wherein, when the new read data includes information indicating that the memory device is in a ready status, the second status information indicates that the memory device is in the ready status.

10. The method according to claim 9, wherein, when the second status information indicates that the memory device is in the ready status, the subsequent command is provided in response to a subsequent request received from the host based on the second status information.

11. The method according to claim 8, wherein, when the new read data includes information indicating that the memory device is in a busy status, the second status information indicates that the memory device is in the busy status.

12. The method according to claim 11, wherein, when the second status information indicates that the memory device is in the busy status, the subsequent command is a status check command for checking a status of the memory device based on the second status information.

13. The method according to claim 12,
further comprising, after the status check command is provided to the memory device, outputting, by the memory device, status information corresponding to the status check command to the memory controller,
wherein the status check command is output until status information indicating that the memory device is in a ready status is output to the memory controller.

14. The method according to claim 8, wherein the providing of the subsequent command to the memory device comprises providing, if the providing of the new read data is completed before the word line discharge is completed, a status check command until the word line discharge operation is completed.

15. The method according to claim 14, wherein the providing of the subsequent command to the memory device comprises providing, when the word line discharge operation is completed, the subsequent command corresponding to a subsequent request received from the host.

* * * * *